Figure 1:
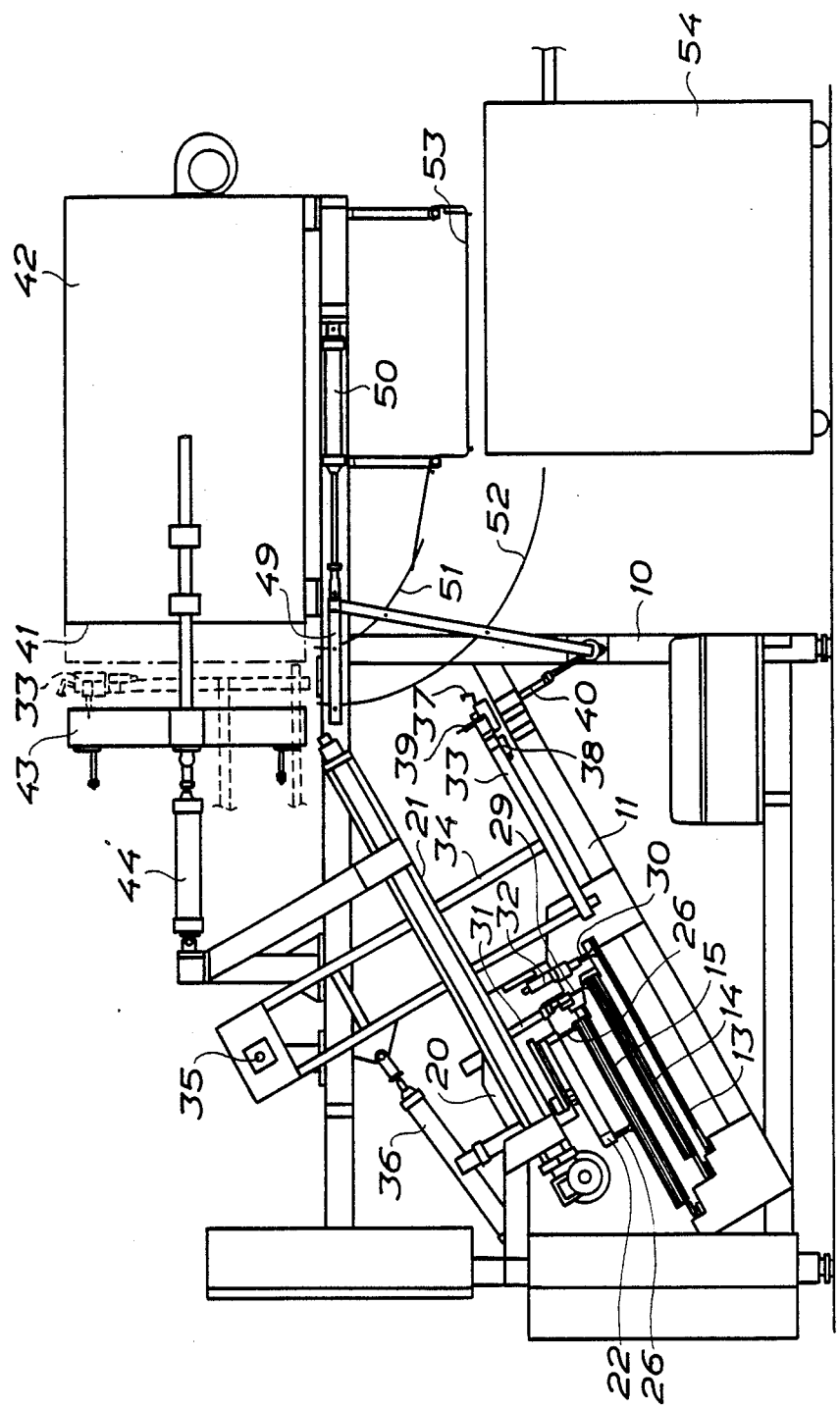

United States Patent [19]

Elwing

[11] Patent Number: 4,931,833
[45] Date of Patent: Jun. 5, 1990

[54] AUTOMATIC PROCESS LINE
[75] Inventor: Ben Elwing, Gislaved, Sweden
[73] Assignee: Johnny Persson, Nassjo, Sweden
[21] Appl. No.: 348,577
[22] PCT Filed: Aug. 29, 1988
[86] PCT No.: PCT/SE88/00440
  § 371 Date: Apr. 27, 1989
  § 102(e) Date: Apr. 27, 1989
[87] PCT Pub. No.: WO89/02097
  PCT Pub. Date: Mar. 9, 1989
[30] Foreign Application Priority Data
  Aug. 27, 1987 [SE] Sweden .................. 8703318
[51] Int. Cl.$^5$ .......................... G03B 27/04
[52] U.S. Cl. .......................... 355/85; 355/99
[58] Field of Search .................. 355/85-87, 355/91, 93, 94, 99, 113, 125

[56] References Cited
U.S. PATENT DOCUMENTS

| | | | |
|---|---|---|---|
| 3,635,559 | 1/1972 | Harrell et al. | 355/85 |
| 3,771,869 | 11/1973 | Diehl et al. | 355/85 |
| 3,810,694 | 5/1974 | Harrell et al. | 355/85 X |
| 3,857,635 | 12/1974 | Niehaus | 355/85 X |
| 4,353,647 | 10/1982 | Harrell et al. | 355/85 |
| 4,423,955 | 1/1984 | Powers | 355/85 X |
| 4,565,433 | 1/1986 | Yazaki | 355/99 |
| 4,575,233 | 3/1986 | Copeland et al. | 355/85 |

Primary Examiner—Richard A. Wintercorn
Attorney, Agent, or Firm—Merchant, Gould, Smith Edell, Welter & Schmidt

[57] ABSTRACT

Automatic process line for exposing photosensitive printing plates with a film and a mask, if any, lying thereon, in a light box. Magazines (13, 14, 15) for plate, film and mask are disposed one above the other in said order from top downwards, displaced in stepped relationship to each other at one side thereof with the lowermost magazine projecting furthest. Moreover, means (20) are provided for picking up plate, film and mask separately at said one side and for picking up the plate also at the opposite side and for displacement thereof stepwise from the pick-up position to a deposit position at said one side of the magazines as well as disposition of plate, film and mask in registered position one on top of the other. A transfer member (33) is provided for receiving plate, film and mask in the deposit position and transferring them to a light box (42) with plate, film and mask in exposure position.

8 Claims, 6 Drawing Sheets

AUTOMATIC PROCESS LINE

The invention relates to an automatic process line for exposing photosensitive printing plates with a film and a mask, if any, lying thereon, in a light box.

Accordingly, the present case concerns an apparatus for handling such aluminium plates having a photosensitive layer, which are used for offset printing and which are bent, after exposure and development, at two opposite edges then to be mounted on a printing cylinder in the printing press. The processing of the plates in case of multi-colour printing with text as well as pictures is very heavy and complicated because it may be necessary to expose a single plate several times in combination with different films and masks before the plate is developed, and this gathering of plates, films and masks is not only time consuming but also necessitates great care and precision in order that each plate will be properly exposed. Automatically functioning apparatus for manufacturing plates is known which is used for printing of black and white only but, as far as is known, not for manufacturing plates for multi-colour printing although there exists a clear demand of the possibility of preparing such plates of high quality rapidly and by small manual efforts.

The object of the invention is to satisfy this demand and to provide an apparatus which is well suited for automation by application of common control technique such that the preparation of the plates can follow a predetermined program without manual intervention.

According to the invention said object is achieved by providing an automatic process line of the kind referred to herein having the characteristics appearing from claim 1.

Figure 2:
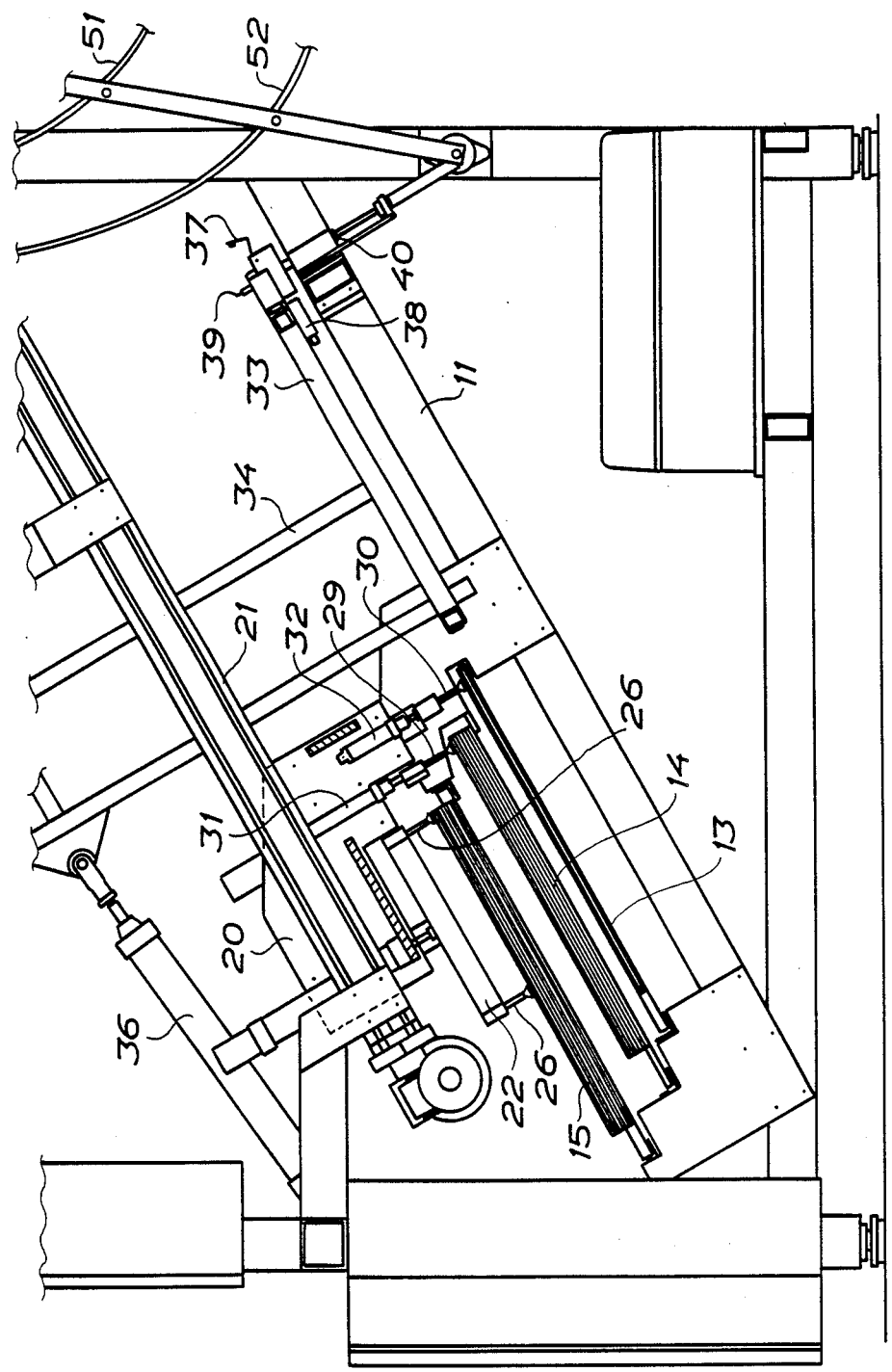
Figure 3:
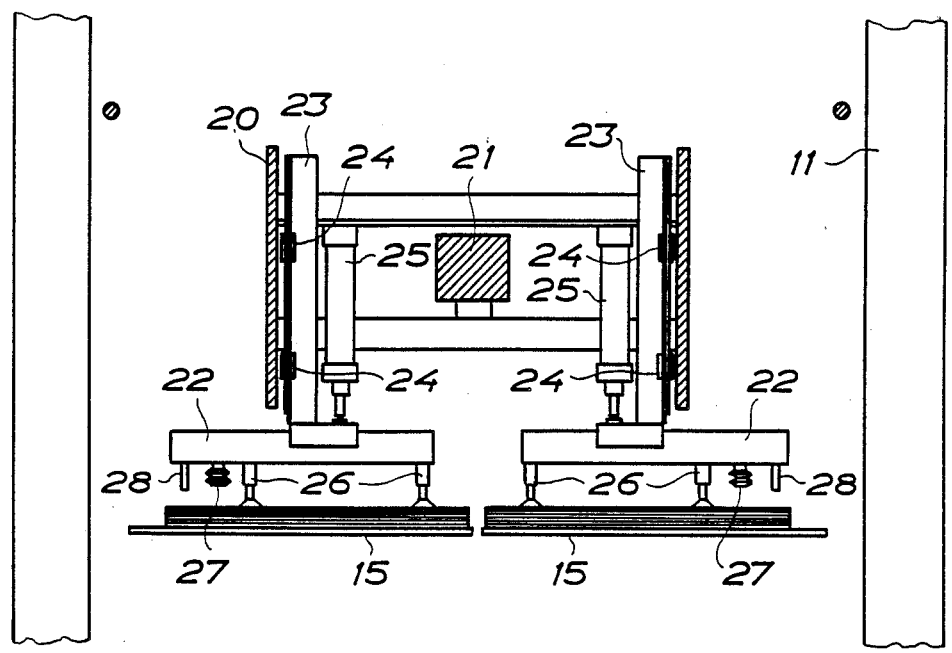
Figure 5:
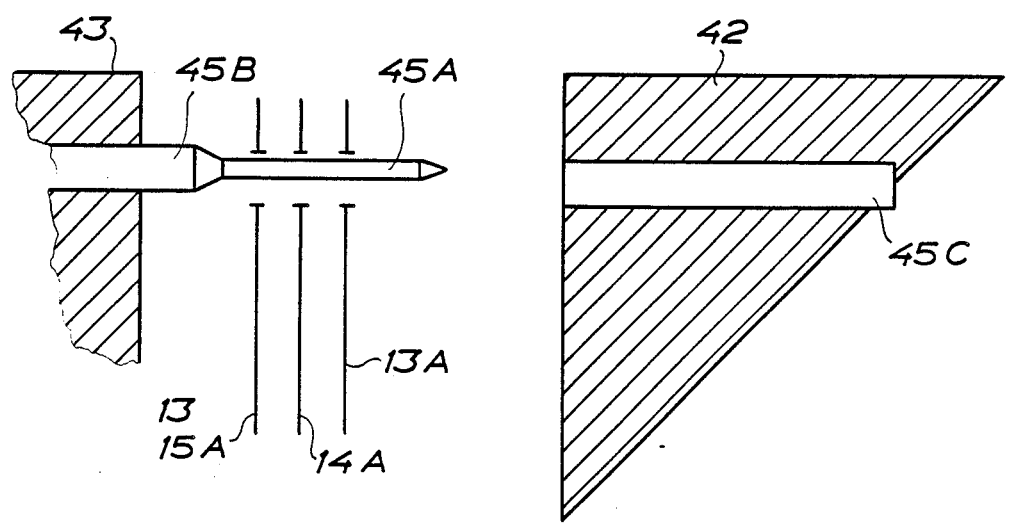
Figure 4:
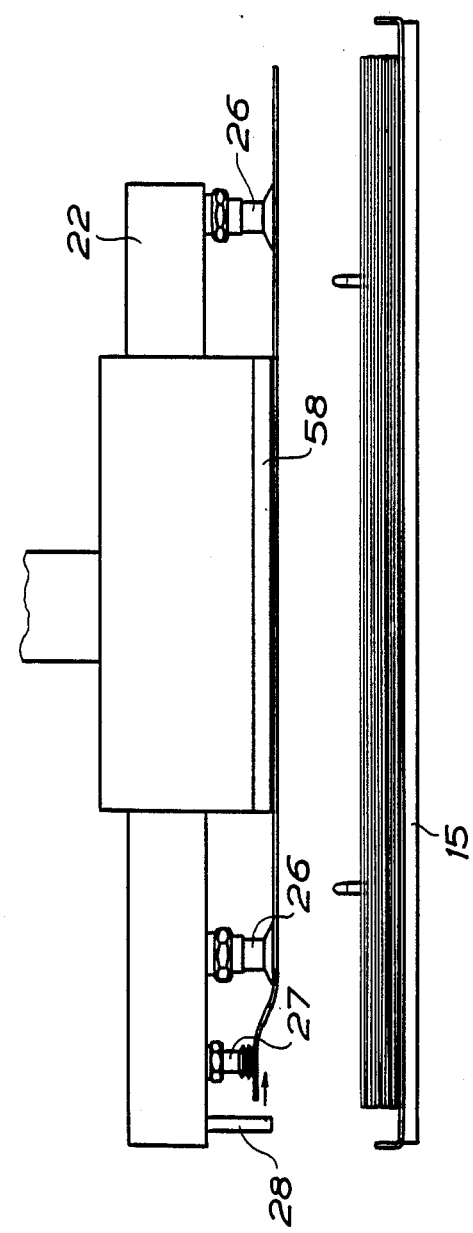
Figure 6:
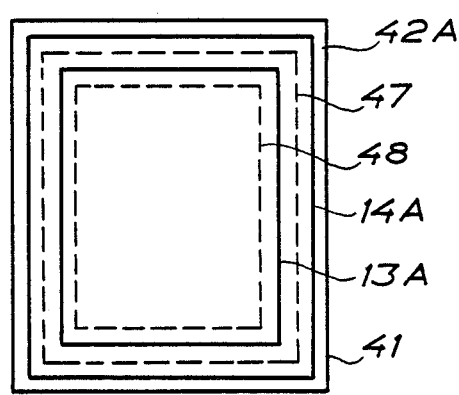

In order to explain the invention in more detail reference is made to the accompanying drawings in which FIG. 1 is a side view of the automatic process line of the invention in one embodiment thereof, FIG. 2 is an enlarged view of a portion of FIG. 1 and FIG. 3 is a fragmentary sectional view along line III—III in FIG. 2, FIG. 4 is an enlarged side view of a frame With suction nozzles forming part of the process line, in a position above a cassette shown in sectional view, FIG. 5 is a diagrammatic and fragmentary side view of control means for centering plate, film and mask on a light box when the plate is being exposed, FIG. 6 is a front view of a glass pane on the light box.

Figure 7:
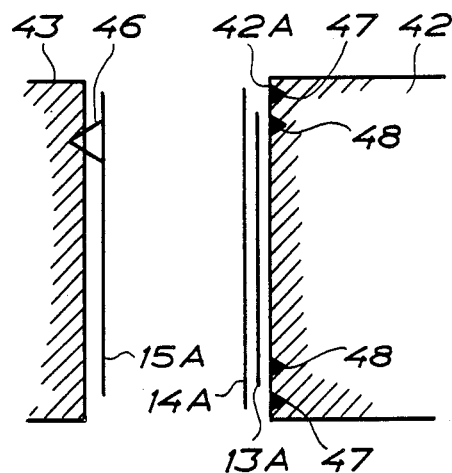
Figure 10:
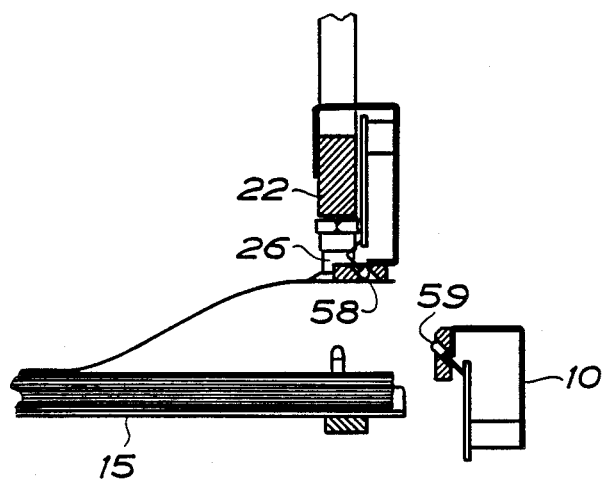
Figures 8, 9:
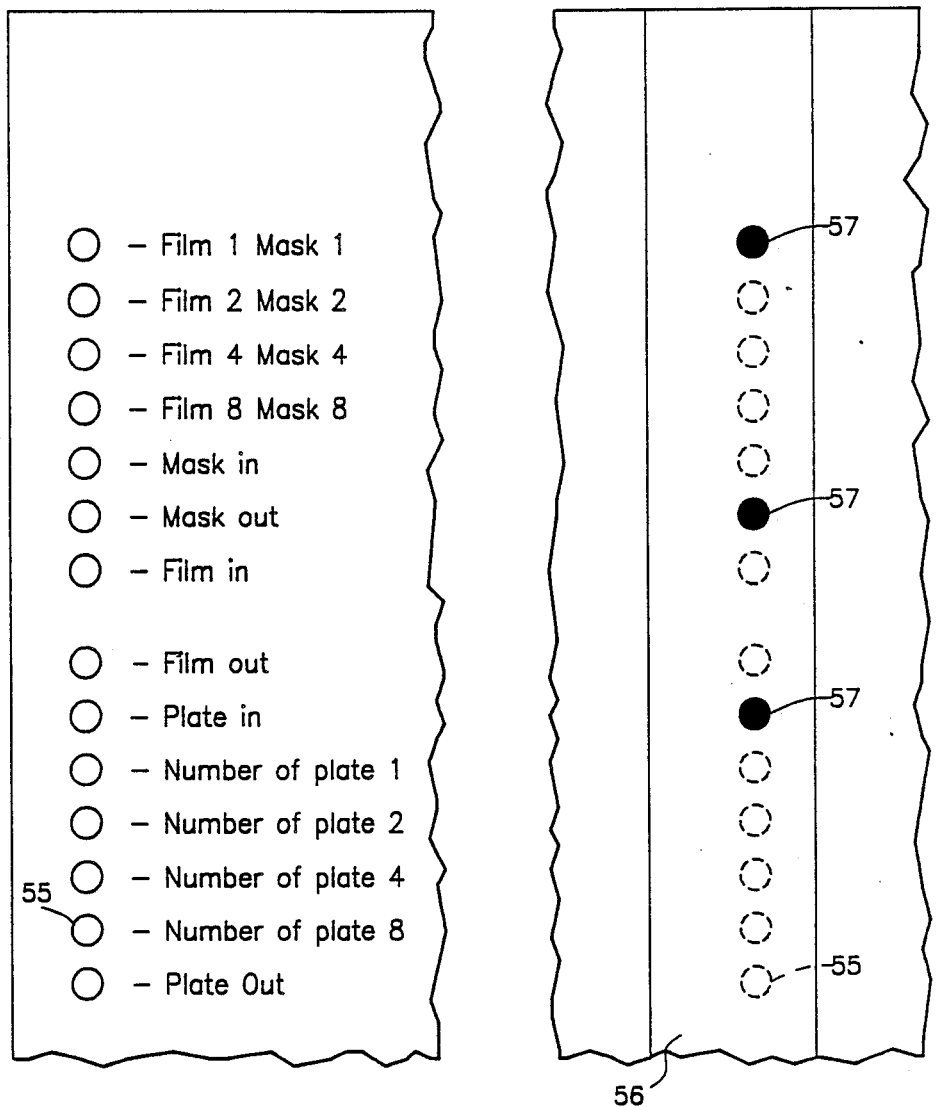

FIG. 7 is a diagrammatic and fragmentary side view of the light box and the sealing door thereof, FIG. 8 is a plan view of a code templet for automatically controlling the processing of plates, films and masks, FIG. 9 is a plan view of a coded film disposed on the code templet, and FIG. 10 is a vertical sectional view of means for reading the code.

In FIG. 1 the process line is shown in its entirety. It is built up on a framework 10 including an inclined magazine section 11 shown in enlarged view in FIGS. 2 and 3. In the magazine section guides 12 are provided for the insertion of three cassettes 13, 14 and 15, the cassette 13 being intended for a stack of masks, the cassette 14 for a stack of films, and the cassette 15 for a stack of aluminium plates having a photosensitive layer. On each cassette the stacks supported thereon should be located in a predetermined position by means of guide pins penetrating through register apertures in the plates, films and masks. The Cassettes are arranged in parallel with each other and are mutually spaced but are not one exactly below the other; they are displaced laterally such that the lowermost cassette with the masks is located furthest to the right, the other cassettes being displaced inwardly in stepped relationship so that a portion of the lowermost cassette and the intermediate cassette is freely available from above at the right-hand edge. The three cassettes can be duplicated such that two cassettes are disposed one beside the other at each level perpendicularly to the plane of the drawing as will be seen from FIG. 3 as far as the cassettes 15 for the plates are concerned.

In the magazine section 11 of the framework 10 a carriage 20 is displaceably guided by connection to a linearly operating ball screw 21 for displacement of the carriage between an end position to the left in FIGS. 1 and 2 as shown in these figures, and an end position to the right. The carriage has means for picking up plates, films and masks one at the time from the related cassettes. For picking up the plates from the cassettes 15 there is provided for each cassette a frame 22 guided for movement on the carriage perpendicularly to the path of movement of the carriage by means of a projecting bar 23 running between grooved pulleys 24. A pneumatic ram 25 is engaged between the carriage and each frame to provide vertical movement up and down of the frame The frame carries two suction cups 26 and a third suction cup 27 said latter suction cup being of the bellow type, cf. FIG. 4, to grip the uppermost plate of the stack in the cassette 15 at the right- and left-hand edges as seen in FIGS. 1 and 2. A nozzle 28 is provided to blow an air jet under the suction cup 27 as will also be seen from FIG. 4. Suction cups 29 and 30, respectively, in combination with a suction cup of the bellow type and a nozzle are guided in a corresponding manner on the carriage for movement up and down such movement being provided by means of 6 pneumatic rams 31 and 32, respectively, for picking up the films and the masks, respectively, one at the time from the related cassettes but at the right-hand edge only as seen in FIGS. 1 and 2. When vacuum is applied in the suction cups the suction cup of bellow type will lift the corner of the related plate, film or mask an air jet at the same time being blown from the nozzle under the raised corner to separate the raised element from the rest of elements received by the related cassette. Films and masks are available so as to be gripped at the right-hand edge only, and it is possible to pick up these elements in the manner described and then to drag them from the cassettes by the movement of the carriage because neither the films nor the masks will be damaged by such treatment. The plates, however, must be lifted completely free when they are picked up because the photosensitive layer otherwise can be damaged because it is easily damaged by mechanical influence. The advantage of the arrangement described is that the carriage by a single movement to the right from the position shown can carry plate, film, and mask from the three cassettes arranged stationarily one above the other, for deposition to the right of the cassettes.

For the reception of plate, film and mask—all at the same time or only one or two thereof—at the deposition there is provided a transfer plate 33 supported by arms 34 which are mounted for pivotal movement about a horizontal shaft 35 on the framework and can be swung by means of a pneumatic ram 36 engaged between the framework and the arms, from the position shown by solid lines in FIG. 1, to the position shown by dash lines in FIG. 1. The transfer plate is provided at the edge thereof which is located at the top in the position shown by dash lines in FIG. 1, with a number of mechanical grippers 37 connected to a pneumatic operating ram 38.

It is assumed that the transfer plate is in the position shown by solid lines, the plate having been swung to this position by means of the ram 36. It is also assumed that the carriage 20 by means of the suction cups thereof has picked up a mask, a film and a plate. The carriage is now moved to the right by means of the ball screw 21, the mask and the film being dragged from the related cassettes while the plate is transported lifted from the associated cassette. The movement of the carriage is effected stepwise, which can easily be arranged by programmed operation of the ball screw. In a first stop position the mask is centered on the transfer plate and will be deposited thereon, after a further movement to the right the film is centered on the transfer plate and will be deposited onto the mask, and after a further movement to the right the plate is centered on the transfer plate and will be deposited onto the film in the righthand end position of the carriage. Mask, film and plate are all released onto guide pins 39 which correspond to the pins in the cassettes and are held in a projecting effective position by means of a pneumatic ram 40, the pins penetrating into the register apertures in mask film and plate. The mechanical grippers 37 are then operated by means of the ram 38, and when the guide pins 39 have been withdrawn, the transfer plate can be swung by means of the ram 36 to the position shown by dash lines in FIG. 1, conveying the mask, film and plate which in this position depend vertically affixed by means of the grippers 37.

In the position shown by dash lines in FIG. 1 the transfer plate is in a position opposite to an end of a light box 42, said end being covered by means of a glass pane 41. At this end the light box can be closed by means of a door 43 constructed as a vacuum box. The door can be displaced by parallel motion between an open position shown by solid lines in FIG. 1, and a closed position shown by dot-and-dash lines in FIG. 1, by means of a pneumatic ram 44. When the transfer plate 33 has been swung upwards to the position thereof opposite to the light box, plate, film and mask shall be transferred to the vacuum box. For this purpose guide pins are provided which can be displaced axially by means of pneumatic rams. The form of the guide pins will be seen from FIG. 5. Each pin has a narrower portion 45A and a thicker portion 45B a conical transition being provided therebetween. The size of the register apertures corresponds to the thicker portion. The pins are projected and are inserted at the narrower portion into the register apertures in plate, film and mask. The grippers 37 can now be disengaged, and the transfer plate will be swung downwards to the lower position thereof.

The light box is closed by moving the vacuum box towards the glass pane 41 of the light box the final exact centration of the plate, film and mask being provided by the thicker portion 45B of the pins penetrating into the register apertures. At the same time the pins are moved into bores 45C in the light box. Then, the plate can be exposed.

When the exposure has taken place the vacuum box will be returned to the position shown by solid lines in FIG. 1. In order to selectively grasp and release exposed plate, film and mask suction cups and suction openings are provided to act on these elements selectively. Referring to FIGS. 6 and 7 there are provided in the vacuum box 43 suction cups 46 to affix the exposed plate 15A. In the glass pane 41 of the light box 42 two suction grooves 47 and 48 are arranged in a rectangle one outside the other. Since the film format is larger than the mask format the film 14A affixed by means of the outer suction groove 47 can be released with the mask 13A remaining on the glass pane. Thus, the mask cannot be released if the film is not also released but there is no need of doing so.

Means for carrying away plate, film and mask after the exposure are provided below the light box. Such means comprise a carriage 49 mounted for pivotal movement in the framework, said carriage being displaceable between a receiving position (shown in FIG. 1) and a withdrawn position by means of a pneumatic ram 50. A carriage is provided with two output passages 51 and 52, passage 51 connecting to a box 53 for the reception of films and masks when they have been finally utilized, and passage 52 connecting to a developer 54 when the carriage is in the receiving position. The carriage 49 is positioned in the receiving position with the passage 51 located for the reception of film and mask from the glass pane of the light box and with the passage 52 located for the reception of the plate.

As mentioned above it is necessary to expose in multicolour printing a single plate several times, different films and masks being used. This means that the transfer plate 33 with the plate remaining on the vacuum box in some instants must fetch only a new film or a new film and a new mask. The process line described is well suited for automation by application of conventional control technique to selectively pick up and remove plates, films and masks. A simple manner of control comprises application of a code on films and masks, said code being read and signals produced by the reading being used for initiating the sequences required for performing the exposure according to the prescribed program which has been set up by classifying and marking films and masks in a suitable way. FIG. 8 discloses a code templet intended for use as a templet for code marking of mask and film. The code templet of FIG. 8 should be placed as a support on the light table which is used in producing film and mask, respectively. The templet has a number of circular markings 55 corresponding to different instructions to the control system of the process line. The film and the mask, respectively, according to FIG. 9 has a transparent edge portion 56 and is located with this edge portion in a fixed position on the code templet. By means of a black Indian ink pen opaque markings 57 are made in register with the relevant circular markings to code the film or mask, respectively. Instead of providing a transparent edge portion or another transparent field on the film or mask, respectively, circular apertures can be punched in an opaque portion of the film or mask, respectively, replacing said opaque markings.

FIG. 10 illustrates how the provided coding can be read when the film or mask, respectively, has been lifted to the upper position thereof by means of the suction cups before the movement of the carriage 20 is initiated. Transmitters 58 such as lamps or photo diodes the number of which equals the number of circular markings 55 (14 in number) and which are distributed in a corresponding row on each frame 22, and a corresponding number of receivers 59 such as photocells arranged in a corresponding way in stationary position on the framework 10 interact to read the code marking on the film or mask, respectively, and forward via electronic circuits corresponding signals to the control system of the process line, the signal pattern being defined in dependence on specific code marking positions being inked or perforated, respectively, or not. Plate, film and mask are picked up in the required combinations and are released selectively after exposure of the plate in dependence on the control signals obtained.

I claim:

1. Automatic process line for exposing photosensitive printing plates with a film and a mask, if any, lying thereon, in a light box (42), characterized by magazines (13, 14, 15) for plate, film and mask disposed one above the other in said order from the top downwards, displaced in stepped relationship to each other at one side thereof with the lowermost magazine (13) projecting furthest, means (20) for picking up plate, film and mask separately at said one side and for picking up the plate also at the opposite side and for displacement thereof stepwise from the pick up position to a deposit position at said one side of the magazines as well as deposition of plate, film and mask in registered position one on top of the other, and a transfer member (33) for receiving plate, film and mask in the deposit position and transferring them to a light box (42) with plate, film and mask in exposure position.

2. Automatic process line as in claim 1 wherein a door (43) for closing the light box is constructed as a vacuum box for supporting the plate, and the light box (42) has vacuum grippers for selected fixation of film and mask.

3. Automatic process line as in claim 2 wherein the transfer member (33) can be inserted between the light box (42) and the vacuum box (43) when the latter box is in the open position.

4. Automatic process line as in claim 2 wherein the vacuum box is provided with guide pins for centering plate, film and mask said pins having a narrower portion (45A) to be initially inserted into plate, film and mask, and a thicker portion (45B) for accurate centration of plate, film and mask when the vacuum box is closed against the light box.

5. Automatic process line as in claim 1 wherein output passages (51, 52) for plate and film and mask, respectively, are adjustably mounted below the light box (42) and the vacuum box (43).

6. Automatic process line as in claim 1 wherein the magazines (13, 14, 15) are mounted in an inclined position and wherein the transfer member (33) comprises a plate mounted for movement in an arc between the deposit position and a position in parallel with the light box (42) over a pivot angle less than 90°.

7. Automatic process line as in claim 1 to 6 wherein film and mask are provided with readable code marking for controlling pick up and deposit of plate, film and mask.

8. Automatic process lines as in claim 7 wherein the code marking comprises opaque marks (57) or perforation in the film or the mask, respectively, and means (58, 59) are provided for reading the marks or the perforation, respectively.

* * * * *

UNITED STATES PATENT AND TRADEMARK OFFICE
CERTIFICATE OF CORRECTION

PATENT NO. : 4,931,833
DATED : June 5, 1990
INVENTOR(S) : Ben Elwing

It is certified that error appears in the above-identified patent and that said Letters Patent is hereby corrected as shown below:

Column 1, line 43, "With" should read --with--.

Column 2, line 2, "Cassettes" should read --cassettes--.

Column 2, line 29, insert --.-- after the word "frame".

Column 2, line 39, delete "6" after the word --of--.

Column 3, line 28, insert --,-- after the word "mask".

Column 3, line 31, "Can" should read --can--.

Column 6, line 22, delete "to6".

Column 6, line 26, "lines" should read --line--.

Signed and Sealed this

Thirty-first Day of March, 1992

*Attest:*

HARRY F. MANBECK, JR.

*Attesting Officer*     *Commissioner of Patents and Trademarks*